(12) United States Patent
Wand et al.

(10) Patent No.: US 6,362,624 B1
(45) Date of Patent: **\*Mar. 26, 2002**

(54) APPARATUS AND METHOD FOR HIGH PRESSURE NMR SPECTROSCOPY

(75) Inventors: Andrew J. Wand, Wallingford, PA (US); Mark R. Ehrhardt, Eugene, OR (US); Jeffrey L. Urbauer, Lawrence, KS (US)

(73) Assignee: The Research Foundation of State University of New York, Amherst, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/428,084

(22) Filed: Oct. 27, 1999

Related U.S. Application Data

(63) Continuation-in-part of application No. 08/967,996, filed on Nov. 12, 1997, now Pat. No. 5,977,772.

(51) Int. Cl.[7] .................................................. G01V 3/00
(52) U.S. Cl. ........................................ 324/321; 324/300
(58) Field of Search .............................. 324/321, 322, 324/318, 300, 319, 320, 314

(56) References Cited

U.S. PATENT DOCUMENTS

| | | | | |
|---|---|---|---|---|
| 4,164,700 A | * | 8/1979 | Christoe et al. | ............ 324/321 |
| 5,045,793 A | | 9/1991 | Rathke | ........................ 324/318 |
| 5,122,745 A | | 6/1992 | Smith | ........................ 324/307 |
| 5,258,712 A | * | 11/1993 | Hofmann et al. | ........... 324/318 |
| 5,517,856 A | | 5/1996 | Hofmann et al. | ........... 324/321 |

OTHER PUBLICATIONS

Wagner, "Activation Volumes for the Rotational Motion of Interior Aromatic Rings in Globular Proteins Determined by High Resolution $^1$HNMR at Variable Pessure", FEBS Letters, Apr. 1980, vol. 112, No. 2, pp. 280–284.

Vannie et al., "Two Approaches to High–Resolution High–Pressure Nuclear Magnetic Resonance", Journal of Magnetic Resonance, 1978, vol. 29, pp. 11–19.

Yamada, "Pressure–resisting glass cell for high pressure, high resolution NMR measurement", Rev. Sci. Instrum., May 1974, vol. 45, No. 5, pp. 640–643.

Roe, "Sapphire NMR Tube for High Resolution Studies at Elevated Pressure", Journal of Magnetic Resonance, 1985, vol. 63, pp. 388–391.

Jonas et al., "High–Pressure NMR Spectroscopy of Proteins and Membranes", Ann. Rev. Biophys. Biomol. Struct., 1994, vol. 23, pp. 287–318.

Jouanne, "High Resolution NMR Under Increased Hyudrostatic Pressure: Keto–Enol Equilibrium of Acetylacetone," Journal of Magnetic Resonace 7, vol. 1, 1972, pp. 1–4.

* cited by examiner

Primary Examiner—Louis Arana
(74) Attorney, Agent, or Firm—Hodgson Russ LLP

(57) ABSTRACT

The present invention provides a pressure cell for pressurizing materials for use in NMR spectroscopy, comprising a sample tube made of sapphire for placing the material, the tube being closed at one end, a housing for holding the sample tube such that the material in the tube can be pressurized, a cove for closing the housing, the cover having an inlet for pressuring the material, means for sealing the cover to the housing, and means of sealing the housing to the sample tube.

15 Claims, 9 Drawing Sheets

APPARATUS AND METHOD FOR HIGH PRESSURE NMR SPECTROSCOPY

This application is a continuation-in-part of a U.S. patent application Ser. No. 08/967,996, filed on Nov. 12, 1997 now U.S. Pat. No. 5,977,772, the disclosure of which is incorporated herein by reference.

This invention was made with government support under grant DK-39806 awarded by the National Institutes of Health. The government has certain rights in the invention.

FIELD OF THE INVENTION

The present invention relates generally to the field of NMR spectroscopy. More particularly, the present invention provides an apparatus and method for high resolution Nuclear Magnetic Resonance (NMR) spectroscopy. This method is particularly useful for determining molecular structure and dynamics in materials such as proteins and protein complexes.

DESCRIPTION OF RELATED ART

The origin of local and global stability and dynamics of proteins and protein complexes have long been of interest and are now of particular importance in the emerging field of protein design and engineering. One approach to the determination of molecular structure and dynamics in proteins involves the use of high pressure NMR spectroscopy. The use of pressure to probe the global and local stabilities of proteins and protein complexes apparently offers the opportunity to selectively destabilize certain classes of interactions with respect to others based on significant differences in the standard free energies and volume changes associated with their disruption. For example, protein complexes that are stabilized by intermolecular salt links are often exquisitely sensitive to pressure and dissociate at pressures of a few hundred bar (Silva et al., 1993, *Ann. Rev. Phys. Chem.* 44:489–113); Weber et al., 1983, *Quaterly Rev. Biophys.* 1689–112; Robinson et al., 1995, *Meth. Enz.* 259:395–427).

Since the pioneering work of Benedek and Purcell (1954, *J. Chem. Phy.* 22:2003–2012) two types of approaches to achieving high pressure NMR capability have evolved. The high pressure probe technique takes the design principle that the entire RF coil and sample are to be pressurized. The original design strategy has been adopted and extended by Jonas and coworkers (Jonas and Jonas, 1994, *Ann. Rev. Biophys. Biomol. Struct.*, 23:287–318; Jonas et al, 1993, *Magn. Reson., Series B*, 102:229–309). The second general approach is the high pressure cell technique which employs thick walled glass (Wagner, 1980, *FEBS Lett.*, 112:280–284), Vespel (Vanni et al., 1978, *J. Magn. Reson.*, 29:11–19) or sapphire (Roe, 1985, *J. Magn. Reson.*, 63:388–391) tubes of various construction or reinforced quartz capillaries (Yamada, 1974, *Rev. Sci. Instrum.*, 45:640–642) which fit directly into a standard NMR probehead.

Previously, others have disclosed pressure cells for use in NMR measurements. U.S. Pat. No. 5,045,793 to Rathke describes the design and use of a high pressure probe with emphasis on the RF coil design. The whole probe was pressurized in order to make the measurements. An operating pressure of 4750 psi (327.5 bar) for 12 hours was used. U.S. Pat. No. 5,122,745 to Smith et al., describes a method and apparatus for determining molecular dynamics of materials. The apparatus entails a high pressure cell where pressures of up to 50 atmospheres (50.7 bar) were achieved. The high pressure cell is combined with an NMR probe to analyze samples. Other reports in the literature, where high pressure was approached, illustrate use of only simple homonuclear NMR spectroscopy at pressures above 1 kilobar (see Jonas and Jonas 1994, supra).

A sapphire tube was used by Roe (1985, supra) to achieve high pressures. The sample tube was mounted to a titanium alloy flange with a single component epoxy adhesive. Pressures of 5000 psi (345 bar) were routinely used. The sapphire tube burst at a pressure of 14,500 psi (1 kilobar).

Thus, while it is of great interest to apply techniques such as NMR spectroscopy to the analysis of pressure-induced transitions in protein complexes, it has not been possible heretofore to subject samples to kilobar pressures. Therefore, there is a need for a pressure cell that can withstand high pressures while allowing state-of-the-art NMR measurements.

SUMMARY OF THE INVENTION

An object of the present invention provides a pressure cell for use in high pressure NMR spectroscopy.

Another object of the present invention is to provide a pressure cell with self-sealing means between various components.

A still further objective of the present invention is to provide methods for analyzing intermolecular interactions by using high pressure NMR spectroscopy.

DETAILED DESCRIPTION OF THE INVENTION

The present invention provides a pressure cell wherein samples can be subjected to high pressure. The pressure cell can be used with any standard NMR instrument without modifications to the spectrometer. The unique design of the components provides for sealing means that are self-sealing thus avoiding the use of glue.

Figure 1:
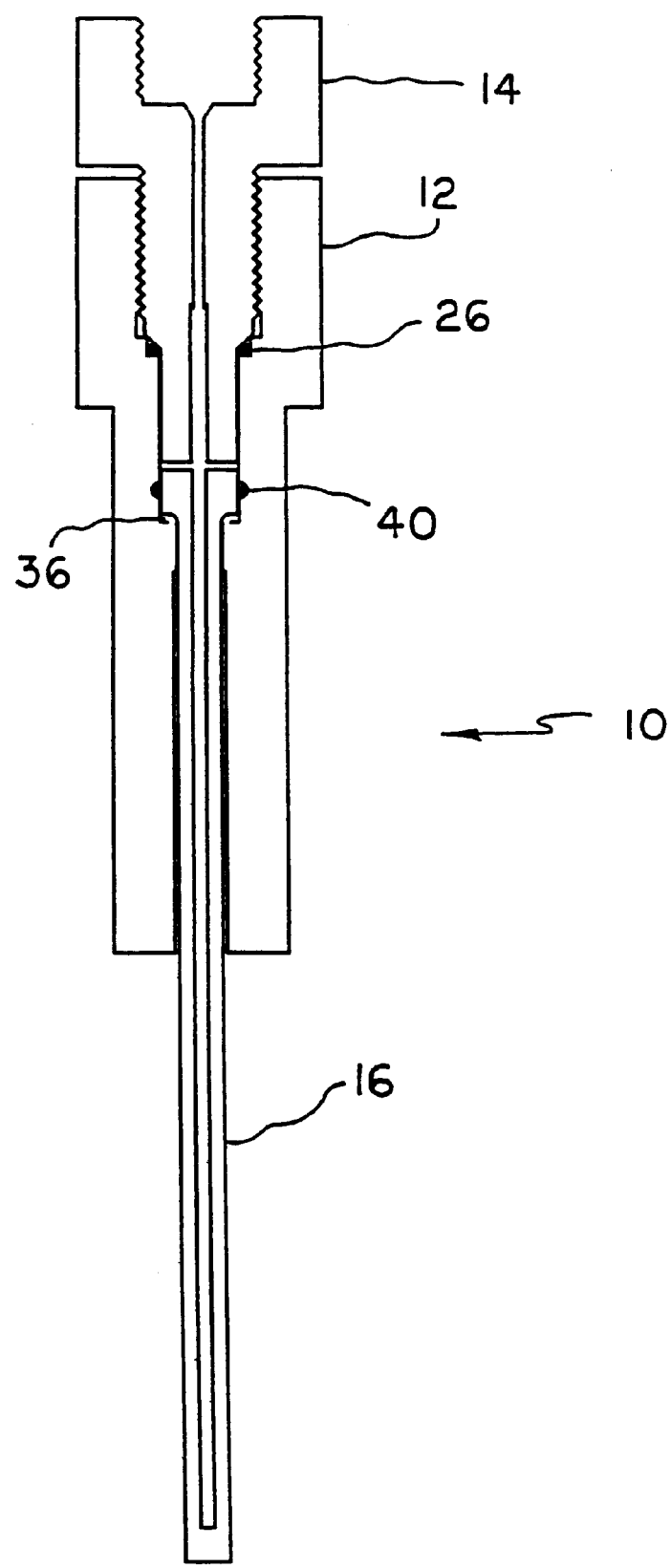
FIG. 1 is an illustration of a cross section of the high pressure cell.

The pressure cell of the present invention is shown in FIG. 1. Pressure cell 10 is comprised of housing 12, cover 14 and sample tune 16. The overall dimensions of the pressure cell can be made so as to fit any standard NMR probe.

Figure 2:
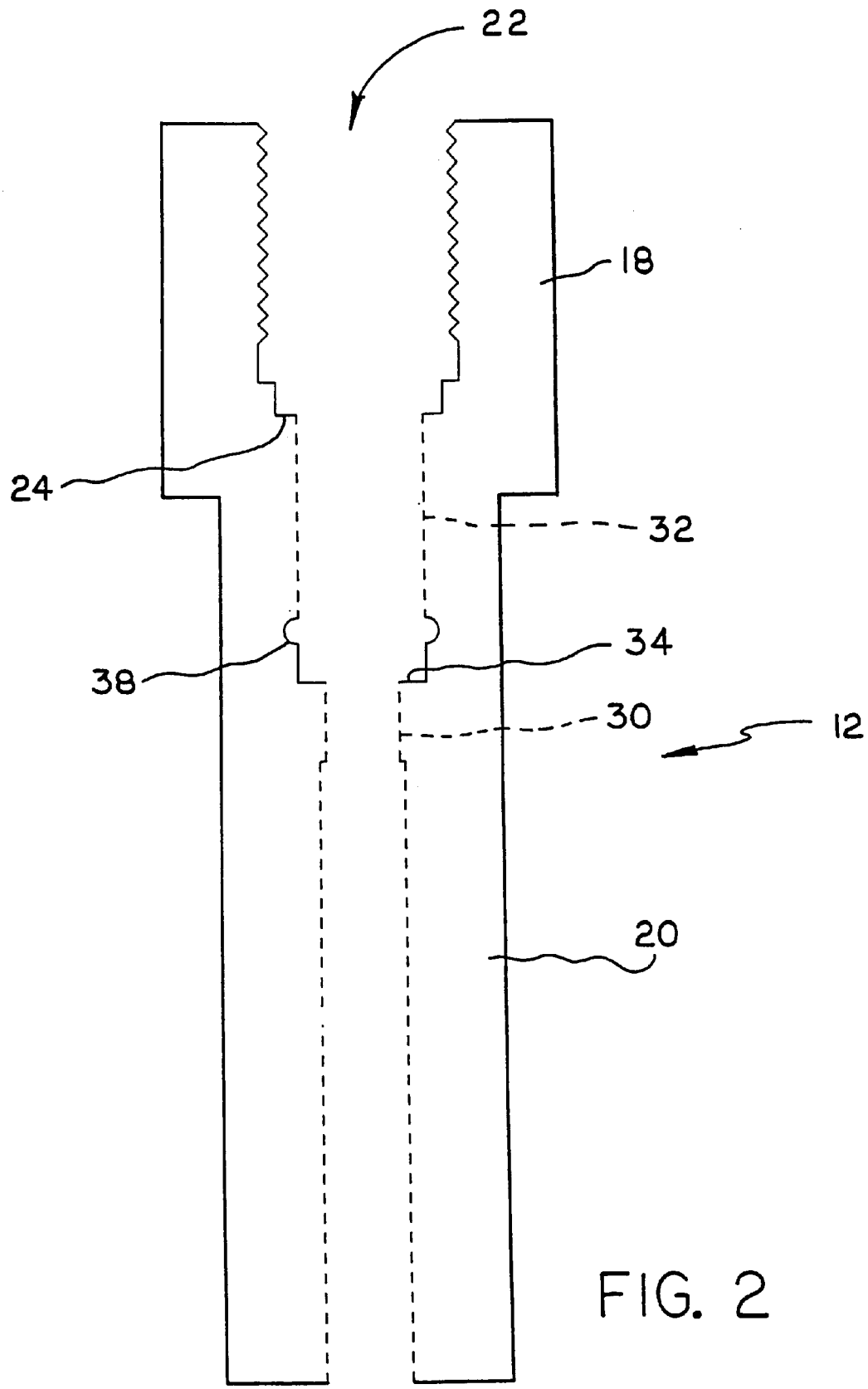
FIG. 2 is an illustration of a cross section of the housing.

As shown in FIG. 2, housing 12 is a stepped cylindrical tube. It is made of a non-magnetic metal with a high tensile strength. Suitable materials for housing include, but are not limited to stainless steel, titanium alloys and beryllium copper alloys. In a preferred embodiment, the housing is made of Be—Cu 25 alloy. Housing 12 has a wide upper section 18 and a narrow lower section 20. Upper section 18 has an internally tapped well 22 to receive cover 14. The bottom corners of the well have a two-step edge. On the lower step 24 is housed an O-ring 26 (AL Xander Co., Inc., Bowmansville, N.Y.) which provides a tight seal between cover 14 and upper section 18. Housing 12 has three bore sections, first bore section 28, second bore section 30 and third bore section 32. Second bore section 30 is narrower than first bore section 28. Third bore section 32 is wider than either first bore section 28 or second bore section 30. The sudden transition from second bore section 30 to third bore section 32 provides a flat surface or collar 34 which forms a sealing surface for sample tube 16. Washer 36 is placed on collar 34 to provide a seal between housing 12 and sample tube 16 on the load bearing side. In a preferred embodiment, the washer is made of boron nitride. This washer also provides a cushion to allow for minor imperfections in the material of the sample tube or the Be—Cu collar 34 without creating localized high stress sites in the crystal. The diameter of third bore section 32 is such that sample tube 16 fits snugly in it. Lower section 20 also has groove 38 to capture O-ring 40 which forms a seal with sample tube 16.

Figure 3:
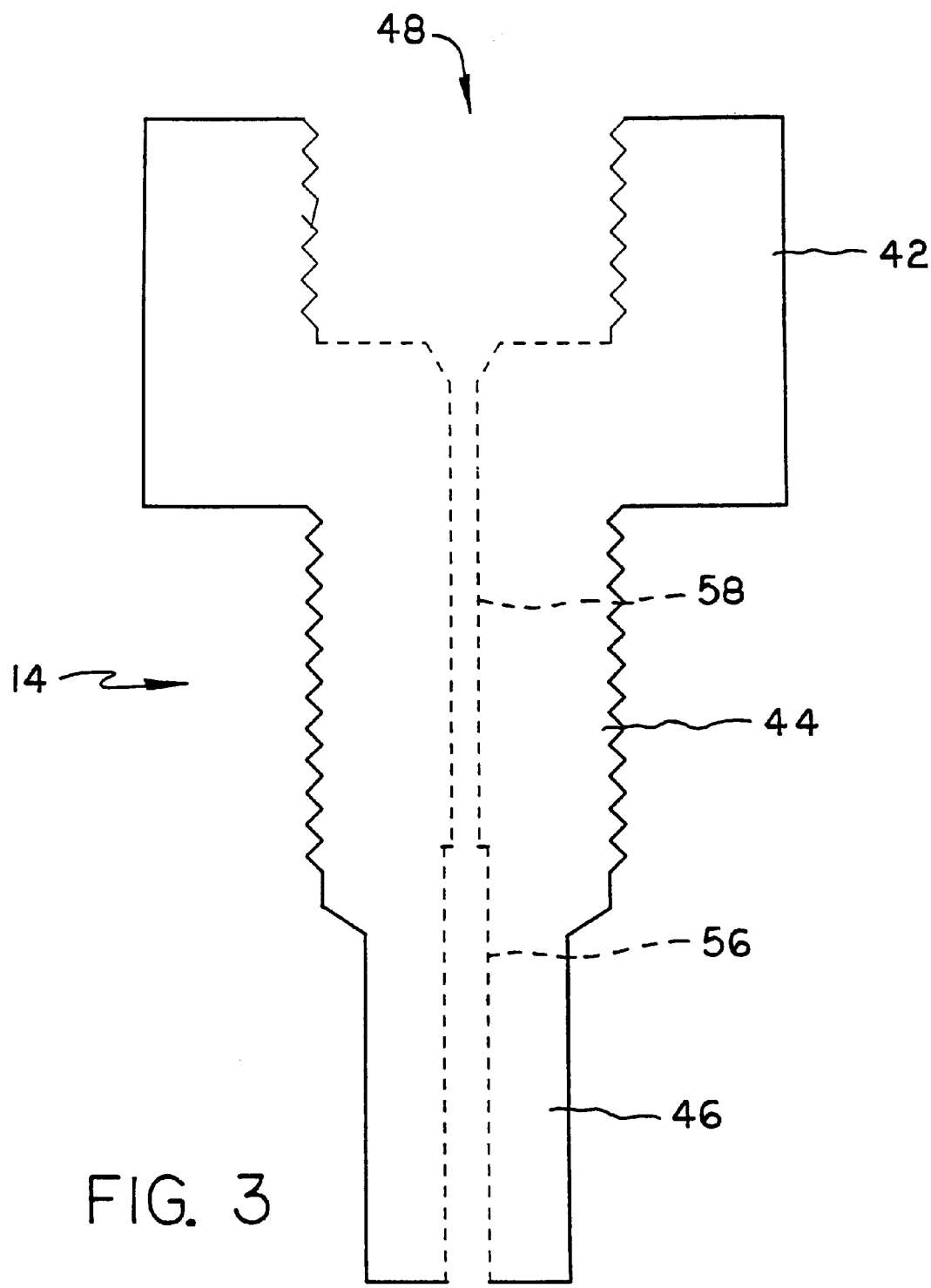
FIG. 3 is an illustration of a cross section of the cover.
Figure 4:
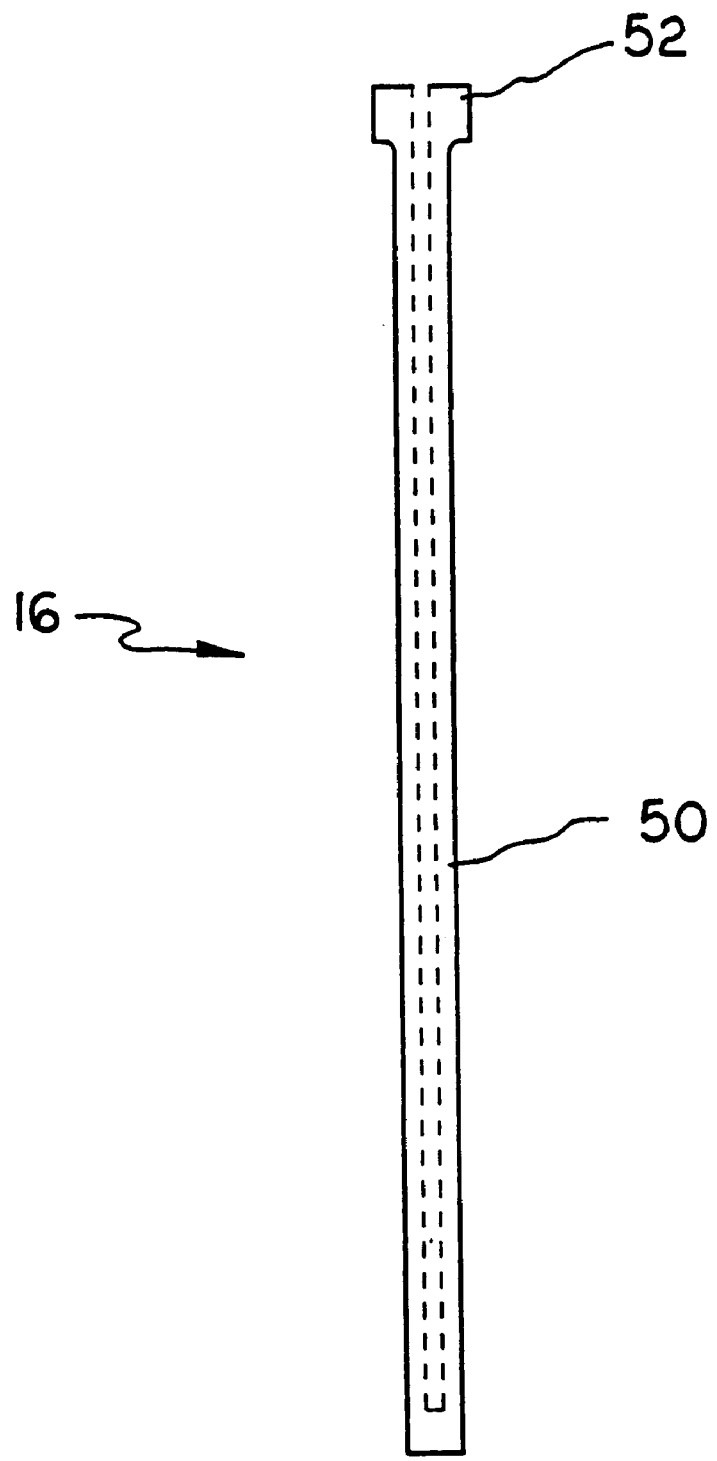
FIG. 4 is an illustration of a cross section of the sample tube.

Cover 14 is made of the same material as the housing and has an internal bore (FIG. 3). When screwed into housing 12, cover 14 fits into internally-tapped well 22. Cover 14 has top section 42, middle section 44 and lower section 46. The outer surface of the middle section 44 is threaded so as to be screwed into internally-tapped well 22 of housing 12. The transition of the outer surface of middle section 44 to lower section 46 is angled so as to capture O-ring 40 against the corner of lower step 24 when cover 14 is screwed into housing 12. Any angle such that the O-ring is not pinched or cut when installing cover 14 into housing 12 can be utilized to house the O-ring against the wall of the lower step 24. In a preferred embodiment, this angle is between about 10° to about 70°. The top of cover 14 has a threaded opening 48 configured to receive any standard pressure fitting. Cover 14 also has a stepped bore with lower bore section 56 receiving a teflon separator (not shown) and upper bore section 58.

The sample tube 16 is made of a material that can withstand high pressure. Suitable materials for the sample tube include, but are not limited to, sapphire, zirconium oxide, and quartz. In a preferred embodiment, the sample tube is made of sapphire. The internal bore of the tube is of the same diameter as the internal bore of cover 14. Sample tube 16 is closed at one end, has main section 50 and flange 52 at the open end. The outer diameter of main section 50 is such that it will fit snugly in second bore section 30. When the sample tube is placed in the housing, flange 52 rests on collar 34.

The dimensions of Sample tube 16 can be varied to fit different probes. For example, in one embodiment, a sample tube of o.d. 5 mm and i.d. 1.5 mm was used. In another embodiment, a sample tube of o.d. 3 mm and i.d. 1 mm was used. Further, the outer dimensions and shape of collar 34 can be varied to conform to probes from different manufacturers.

The above-described apparatus can be used in NMR spectroscopy to examine intermolecular interactions. Pressures of 16,000 psi have been used for days by using the pressure cell of the present invention. The O-rings used in the present invention provide the means for self-sealing under pressure. This avoids the use of glue, which typically does not withstand high pressures. An advantage of the present apparatus is that a standard NMR probehead can be used. More importantly, the above-described apparatus allows state-of-the-art NMR spectroscopy to be performed at high pressures. This includes multinuclear, mutidimensional NMR techniques which have heretofore not been possible. Another advantage is that liquid pressurization can be used which is safer and more cost effective than gas pressurization.

To perform analysis of samples, a small volume, for example, 80–100 ml, of the sample is loaded into the sapphire tube. A teflon separator, approximately 1" long, is inserted into the top of the tube bore. The cover is then screwed to the top of the housing. Water is added to the space above the teflon separator. A standard threaded pressure fitting is connected to the cover and the pressure cell is placed in a standard bore magnet. The pressure fitting is in turn connected to a standard commercial liquid (ethanol) generator (High Pressure Equipment Co., Erie, Pa.) via suitable high pressure tubing. The pressure generated by ethanol is transduced to the water in the pressure cell via a titanium plunger. Suitable sealing means like O-rings in conjunction with the plunger separates the ethanol from water. The use of water ensures that no mixing of pressurizing chemicals (i.e. ethanol) with the aqueous sample can occur. Liquid pressurization (ethanol transduced to water) increases reliability and safety of the device. No modification of the spectrometer hardware is required.

EXAMPLE 1

In one embodiment, a Pressure cell was constructed for use with Varian Inova 600 MHz and 750 MHz, 51 mm magnet bore NMR Instrument. Averting to FIGS. 1–4, the housing has a first bore section 28 of 0.234" diameter which transitions into a 0.204" second bore section 30 and then into a 0.350" third bore section 32. The transition from the 0.204" bore to the 0.350" section provides a flat surface or collar 34 on which a boron nitride washer is placed to provide a seal between the housing and the sapphire tube 16 on the load-bearing side. The single crystal sapphire tube 16 is 4.97" long and has a diameter of 0.197" with a flanged end. Flange 52 is 0.200" high with a diameter of 0.343" which allows for a nominal clearance of 0.001" between the flange and the housing when the sapphire tube is placed inside the housing. The surface of the flange is ground to <0.001" to provide a uniform surface to seal against. Main section 50 of the sapphire tube of diameter 0.197" provides a nominal clearance of 0.0035" with the second bore section 30. Groove 38 has a Buna 90 O-ring (8.5 mm×2.0 mm) installed in it to form a seal between the sapphire tube flange 52 and the Be—Cu housing 12. This O-ring seal is critical and must fill the groove to approximately 95% when assembled. Moreover, there should be no more than 0.001" of space between third bore section 32 and flange 52 to avoid extrusion of the O-ring.

EXAMPLE 2

To study interactions between apocalmodulin and a peptide corresponding to the calmodulin-binding domain of neuromodulin, a Neuro-P peptide was prepared with N-terminal G-S extension by expression as a gluthione-S-transferase fusion protein in *E. Coli* during growth in $^{15}$N, $^{13}$C-enriched minimal media. The cleaved, purified doubly-labeled peptide was titrated with unlabeled apocalmodulin under low ionic strength conditions and followed by $^{15}$N-HSQC spectra (FIGS. 5–9). All samples were prepared in 2.5 mM imidazole-$d_4$, 2.5 mM KCl, 0.025 mM EDTA and 0.02% $NaN_3$ at pH 6.5 (uncorrected for the isotope effect). The NMR spectra of both free apocalmodulin and in the 1:1 complex with Neuro-p were assigned using triple resonance spectroscopy according to the method of Urbauer et al. (1995, *Biochem.*, 34:8099–8109), which method is hereby incorporated by reference. All HSQC spectra were acquired as 1024 ($^1H$) by 64 ($^{15}N$) complex point data sets (64 scans/FID) using a sensitivity-enhanced pulsed field gradient technique.

Figure 5:
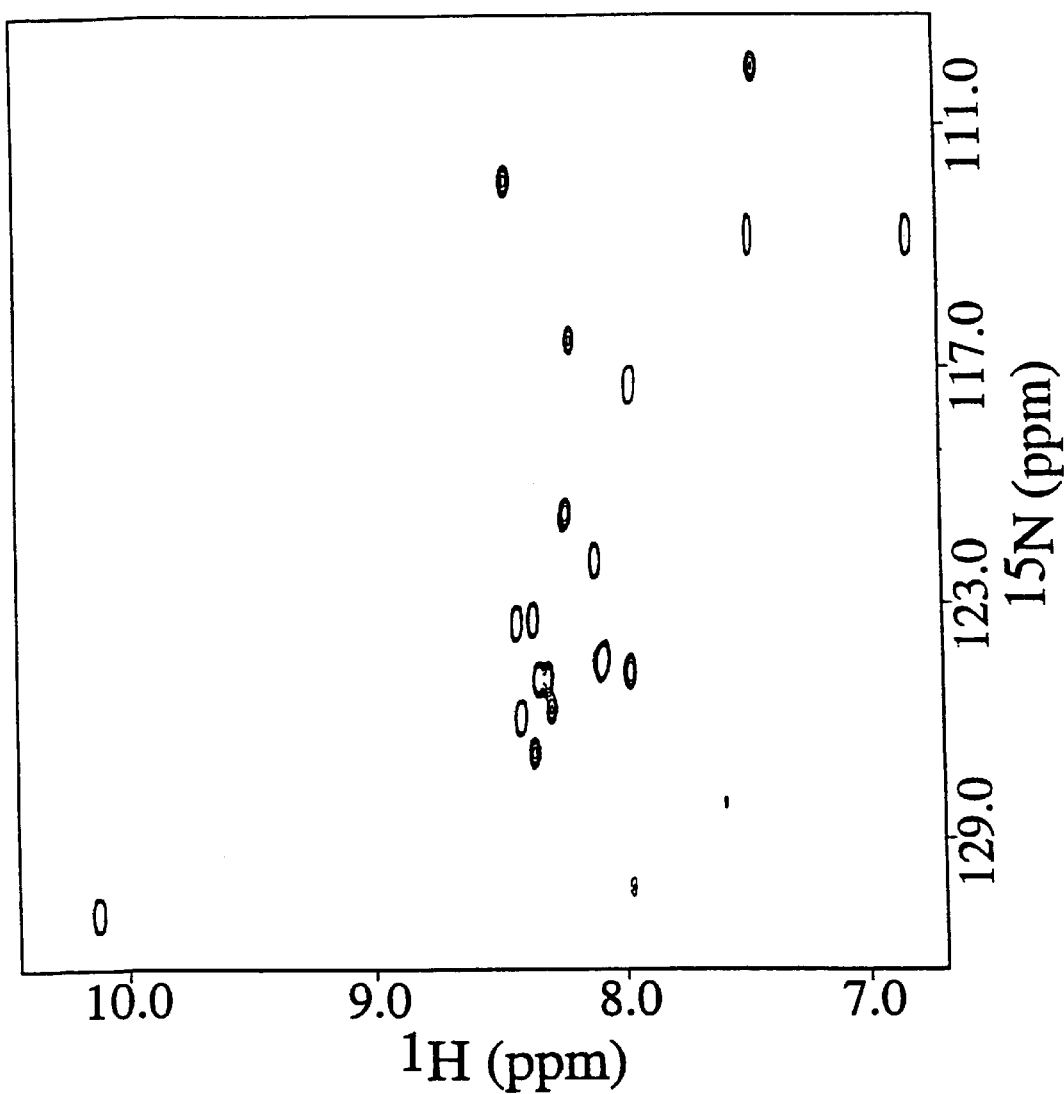
FIG. 5 is a representations of the $^{15}$N HSQC spectrum of Neuro-p peptide in a 5 mm outer diameter (o.d.) tube.
Figure 6:
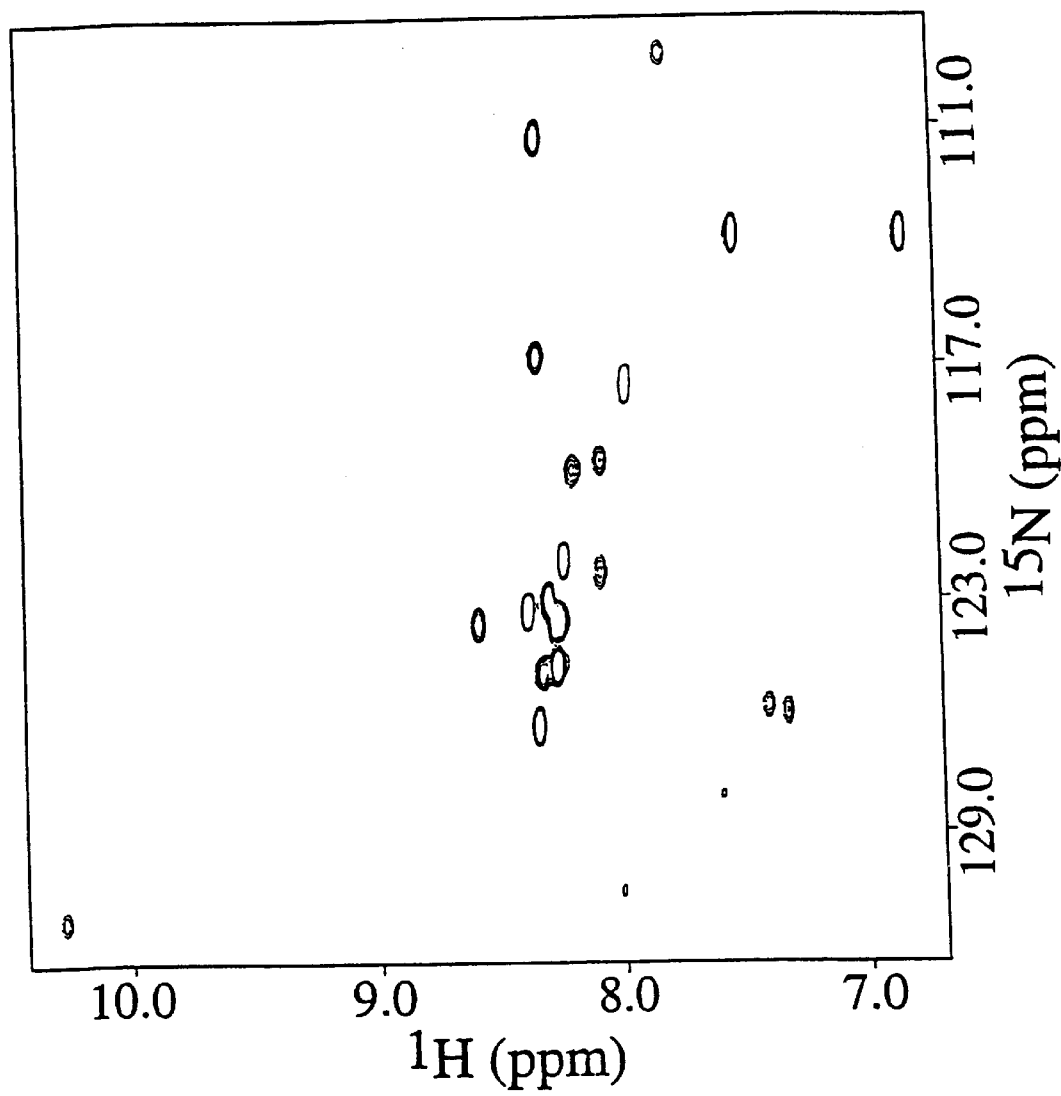
FIG. 6 is a representations of the $^{15}$N HSQC spectrum of Apocalmodulin-Neuro-p complex in a 5 mm o.d. NMR tube.
Figures 7, 7A, 7B:
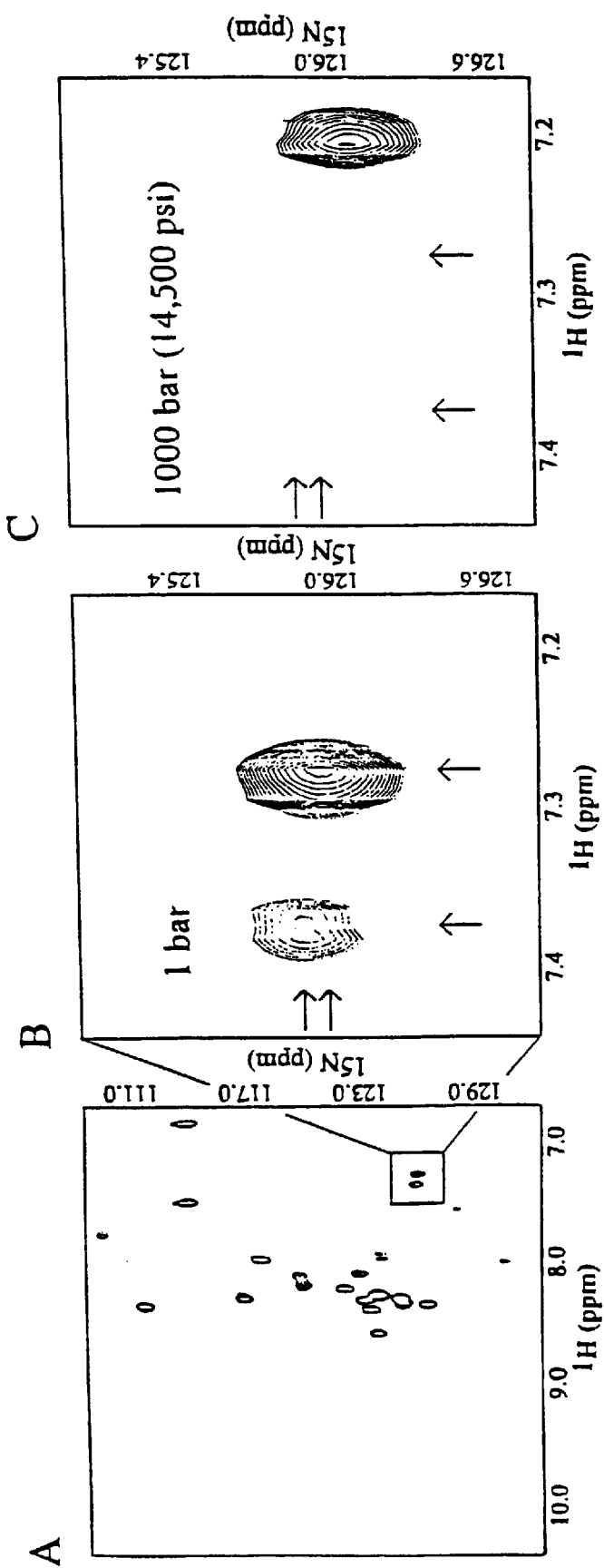
FIG. 7 is a representation of the $^{15}$N HSQC spectrum of Apocalmodulin-Neuro-p complex in a high pressure tube of the present invention.
FIGS. 7A and 7B is an expansion of the enclosed region in FIG. 7 at a pressure of 1 kilobar.
Figure 8:
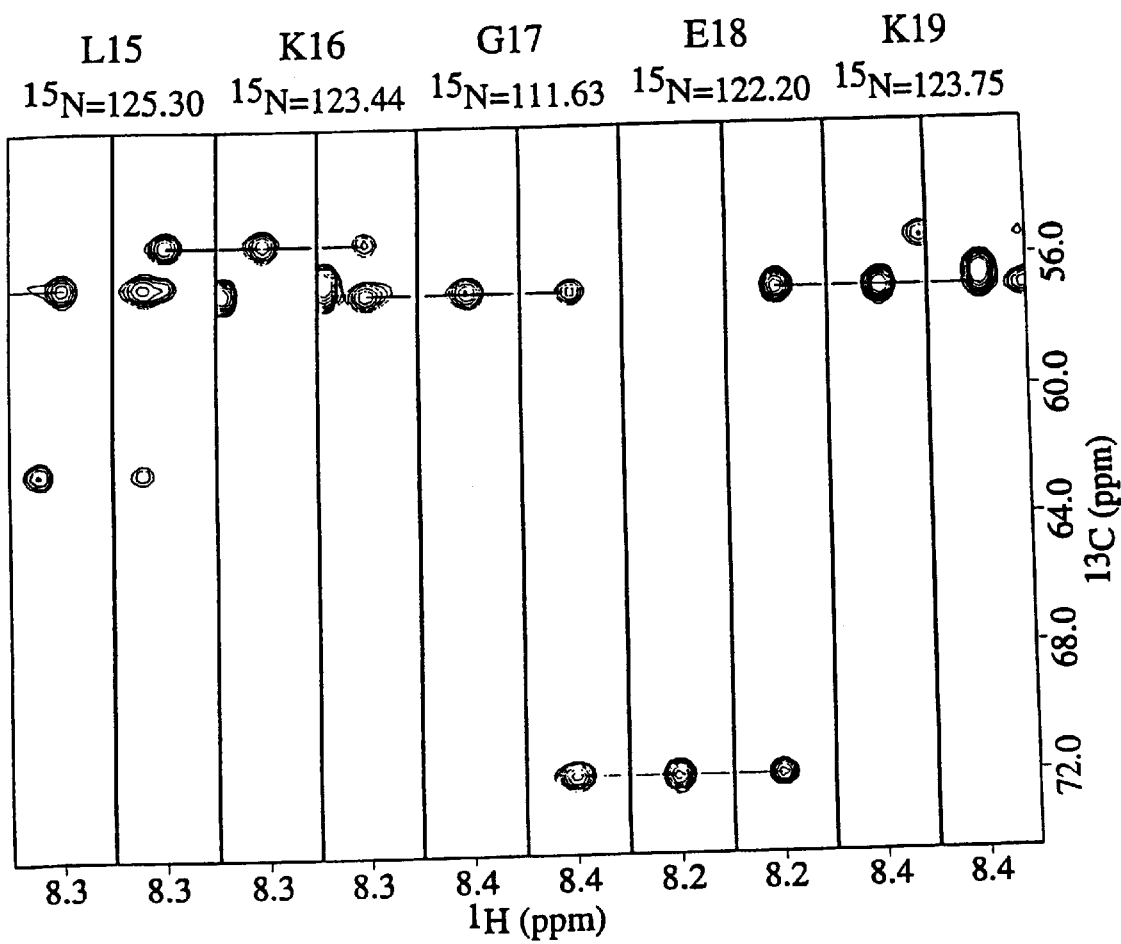
FIG. 8 is a representation of the HNCA and NH(CO)CA spectra of Apocalmodulin-Neuro-p complex.
Figure 9:
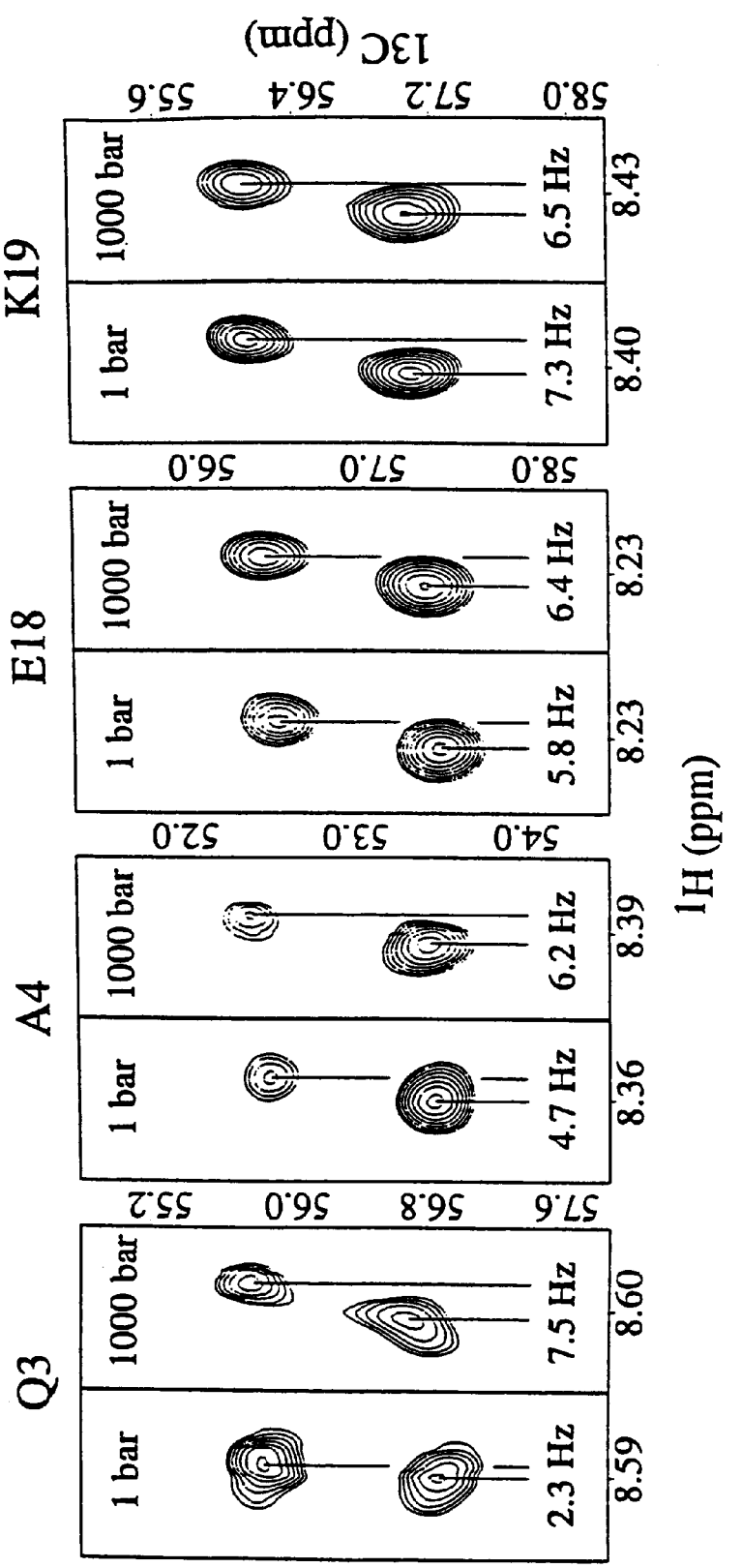
FIG. 9 is a representation of representative expansions of the HNCA-J spectra at ambient pressure.

The peptide used has the sequence GSQASWRGHITRKKLKGEKG. FIG. 5 shows the $^{15}N$ HSQC spectrum of the free Neuro-p peptide in a 5 mm (o.d.) NMR tube. FIG. 6 shows the $^1H$-$^{15}N$ HSQC spectrum of the 1:1 apocalmodulin. Neuro-p complex (1 mM) in a standard 5 mm (o.d.) NMR tube (Wilmad 528). FIG. 7 shows the same sample as in FIG. 6 concentrated four fold (4 mM) into the sapphire high pressure tube (5 mm o.d./1.5 mm i.d., ~80 mL active volume) at ambient pressure (~1 bar). Expansions showing the e $^1H$-$^{15}N$ correlations of R7 and R12 of the bound peptide (aliased from ~85 ppm) at ambient pressure (~1 bar) and 1 kilobar are shown in FIGS. 7A and 7B respectively. Arrows indicate peak centers at ambient pressure. Main chain assignments backbone of the Neuro-p peptide bound to apocalmodulin were obtained using triple resonance spectroscopy. The HNCA and HN(CO)CA spectra are shown in FIG. 8 and representative expansions of HNCA-J spectra are shown in FIG. 9. All spectra were acquired with a Varian Unity Inova 600 MHz spectrometer using a standard z-gradient triple resonance probe.

Upon binding to apocalmodulin, the $^{15}N$-HSQC spectrum of the peptide changes significantly (compare FIGS. 5 and 6). Especially noteworthy are the two resonances associated with the Arginine side chain guanidino moieties of the peptide. In the free peptide, hydrogen exchange with solvent is efficient enough to cause total loss of cross peaks from these groups. Upon binding to apocalmodulin, strong cross peaks arising from these groups appear in the $^{15}N$-HSQC indicating their participation in hydrogen bonding interactions with apocalmodulin. Application of high pressure results in significant changes in the spectrum of the bound peptide. At 1.0 kilobar there is a marked reduction in the intensity of the two guanidino cross peaks indicating that interactions with apocalmodulin are being broken. Quantitation of this effect reveals that an apparent free energy change of ~2 kcal $mol^{-1}$ and a standard volume change of ~60 mL $mol^{-1}$ is associated with the pressure induced reorganization of the complex. These data point to the involvement of ionic interactions between R7 and R12 of the peptide and acidic residues of apocalmodulin in maintaining the uniqueness of this particular complex. The HNCA and HN(CO)CA spectra were acquired in the sapphire high pressure tube using sensitivity-enhanced pulsed field gradient techniques of Muhandiram and Kay, 1994 (*J. Magn. Reson. Series B*, 103:203–216), which method is hereby incorporated by reference. The conformation of the main chain of the bound Neuro-p peptide was characterized by HNCA-J spectra obtained at ambient pressure and at 1 kilobar Comparison of triple resonance HNCA-J spectra of the bound peptide obtained at 1 bar and at 1.0 kilobar according to the method of Seip et al., 1994 (*J. Magn. Reson. Series B*, 104:172–179). These spectra provide access to changes in the main chain torsion angle phi via $^3J_{HNHa}$. These data show that the main chain of the bound peptide is only slightly perturbed during this reorganization. The spectra shown in FIG. 5 illustrate that the overall performance of the device in terms of linewidth, lineshape and sensitivity is sufficient to efficiently carry out advanced NMR spectroscopy.

It is appreciated that various modifications to the inventive concepts described herein may be apparent to those skilled in the art without departing from the spirit and scope of the present invention defined by the hereafter appended claims.

What is claimed is:

1. A Pressure Cell for pressurizing material for use in NMR spectroscopy, comprising:
   a sample tube for placing the material;
   a housing for holding the sample tube such that the material in the tube can be pressurized;
   a cover for closing the housing, said cover having an inlet for pressuring the material;
   means of self-sealing under pressure said cover to said housing; and
   means of self-sealing under pressure said housing to said sample tube.

2. The Pressure cell of claim 1, wherein the means of sealing the cover to the housing comprises an O-ring.

3. The Pressure cell of claim 1, wherein the means of sealing the housing to the sample tube comprises an O-ring and a washer.

4. The Pressure Cell of claim 1, wherein the housing further comprises a first bore section, a second bore section and a third bore section.

5. The Pressure cell of claim 4 wherein the open end of the sample tube is flanged and the transition between the second bore section and the third bore section forms a collar, said collar supporting the flanged end of the sample tube.

6. The Pressure Cell of claim 5, wherein the housing further comprises a groove for receiving an o-ring, said groove operatively arranged to surround the flanged end of the sample tube.

7. The Pressure Cell of claim 6, wherein means of sealing the sample tube to the housing comprises
   an O-ring housed in said groove; and
   a washer between said collar and said flanged end of said sample tube.

8. The Pressure Cell of claim 7, wherein the washer is made of boron nitride.

9. The Pressure Cell of claim 4, wherein
   the transition between said first bore section and said second bore section comprises at least an upper step and a lower step;
   the cover has an angled section such that the angled section covers the lower step of the housing providing a place for capturing an O-ring therebetween;
   means of sealing said cover to said housing comprises an O-ring, said O-ring being captured between said lower step and said angled section of the cover.

10. The pressure cell of claim 1, wherein said housing and said cover are made of Be—Cu alloy.

11. A method of performing NMR measurements on a sample comprising the steps of:
   a. enclosing the sample in a pressure cell of claim 1;
   b. inserting said cell in an NMR probe;
   c. introducing a fluid pressure in said cell;
   d. subjecting said probe to a magentic field;
   e. varying said pressure; and
   f. collecting resultant NMR spectra.

12. The method of claim 9, wherein said fluid is a liquid.

13. The method of claim 9, wherein said pressure is about 1 kilobar.

14. The Pressure Cell of claim 1, wherein the sample tube is made of zirconium oxide.

15. The Pressure Cell of claim 1, wherein the sample tube is made of quartz.

* * * * *